US006399954B1

United States Patent
Seto et al.

(10) Patent No.: US 6,399,954 B1
(45) Date of Patent: Jun. 4, 2002

(54) CHARGED-PARTICLE BEAM LITHOGRAPHY APPARATUS AND SYSTEM CAPABLE OF READILY DETECTING ABNORMALITY IN CONTROLLING ON-OFF OPERATION

(75) Inventors: Isamu Seto; Atsushi Saito; Hidefumi Yabara, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/241,576

(22) Filed: Feb. 2, 1999

(30) Foreign Application Priority Data

Feb. 2, 1998 (JP) .......................................... 10-021185

(51) Int. Cl.[7] .............................................. H01J 37/302
(52) U.S. Cl. ................................................ 250/492.22
(58) Field of Search .......................... 250/492.22, 398, 250/492.2, 396 R (56) References Cited

U.S. PATENT DOCUMENTS 5,260,579 A * 11/1993 Yasuda et al. .............. 250/398
5,449,915 A * 9/1995 Yamada et al. ............. 250/398
5,841,145 A * 11/1998 Satoh et al. ........... 250/492.22
5,910,658 A * 6/1999 Arai et al. ............. 250/492.22

* cited by examiner

Primary Examiner—Kiet T. Nguyen
(74) Attorney, Agent, or Firm—Christie, Parker & Hale, LLP

(57) ABSTRACT

Disclosed is a charged-particle beam lithography apparatus capable of readily detecting an abnormality in controlling the on-off operation of a charged-particle beam. The charged-particle beam lithography apparatus consists of a charged-particle beam generator, a charged-particle beam reshaping unit, a charged-particle beam converging unit, a charged-particle beam deflecting unit, a blanking unit, a digital converting circuit, and a comparing circuit. The blanking unit produces a blanking signal used to control the on-off operation of a charged-particle beam according to exposure pattern data, and thus controls the on-off operation of the charged-particle beam. The digital converting circuit produces a blanking data signal that is a digital signal indicating a variation of the blanking signal. The comparing circuit compares the blanking data signal with the exposure pattern data. It is detected whether the on-off operation of the charged-particle beam is controlled according to the exposure pattern data.

12 Claims, 9 Drawing Sheets

CHARGED-PARTICLE BEAM LITHOGRAPHY APPARATUS AND SYSTEM CAPABLE OF READILY DETECTING ABNORMALITY IN CONTROLLING ON-OFF OPERATION

BACKGROUND OF THE INVENTION

1. Field of the Invention

The present invention relates to a charged-particle beam lithography apparatus using an electron beam or the like. More particularly, this invention is concerned with a blanking signal used to control the on-off operation of a charged-particle beam employed in a charged-particle beam lithography apparatus, and circuits handling the blanking signal.

2. Description of the Related Art

Owing to advances in fine processing technology, semiconductor integrated circuits tend to have circuit elements thereof integrated even more densely. The performance the fine processing technology is now required to offer is very high. Especially in a lithographic technology, a photolithographic technology adopted for an existing stepper will soon reach its limits. A charged-particle beam lithographic technology or especially an electron-beam lithographic technology is expected to produce the next generation of fine processing. How the throughput or reliability of fine processing should be improved is a technological obstacle to be overcome. An electron-beam lithography apparatus will be described as an example below. The present invention is not limited to the electron-beam lithography apparatus.

The electron-beam lithography apparatus is available in a variable rectangular lithography mode type, a block lithography mode type, and a multibeam lithography mode type. The present invention can be adapted to these modes. Herein, the block lithography mode will be described as an example. In the block lithography mode, a pattern that is a unit to be repeated for drawing graphics is delineated on a transparent mask. An electron beam is passed through the transparent mask. Delineated patterns are then transferred simultaneously and concatenated later. Thus, the repetitive graphics are drawn. One irradiation of an electron beam for transferring the unit pattern is called a shot. Herein, the term "shot" will be adopted.

The electron-beam lithography apparatus converges a reshaped electron beam on a sample, and controls the on-off operation of the electron beam while changing an irradiated position at which the electron beam is irradiated. The electron-beam lithography apparatus thus exposes the sample to transfer a desired pattern. For controlling the on-off operation of the electron beam, a blanking signal is applied to a blanking deflector. When the electron beam is irradiated (turned on), it will not be deflected. When the electron beam is not irradiated (turned off), it will be deflected and intercepted. In other words, the sample is exposed with the electron beam turned on. If an error occurs in exposure time (shot time), exposure will not be carried out in a desired manner. The exposure time must therefore be set very precisely. Moreover, the exposure time must coincide exactly with deflection of the electron beam.

According to a typical block lithographic mode, the number of times of electron-beam irradiation (number of shots) is as large as 10 M shots per chip or 1 G shots per wafer. The cycle of electron-beam irradiation is about 10 MHz. A clock generating circuit for generating a clock signal used for synchronization generates a blanking signal that is turned on or off at a very high rate equivalent to 10 MHz. The clock generating circuit then applies the blanking signal to a blanking deflector. An electron-beam lithography apparatus is realized with hardware including mechanisms such as a column and stage, an exposure control unit, and an analog amplifier (driver) for operating deflectors. A high voltage is employed in many components, and various kinds of noise therefore arise. The causes of noise are, for example, discharge occurring in high-voltage components or an electron gun, a noise occurring in a lens power source, charging of the column, and bit missing or incorrect latching occurring in a digital arithmetic circuit or amplifier included in an exposure control unit. As mentioned above, the blanking signal is a very important signal. If any noise occurs, a problem arises in that a beam may be twisted or a shot may be skipped. If this kind of abnormality occurs, the cause thereof must be investigated and the electron-beam lithography apparatus must be restored immediately to its normal state. In particular, as far as an electron-beam lithography apparatus employee in the process of mass production is concerned, a decrease in operation time of the apparatus leads directly to an increase in cost of production. An electron-beam lithography apparatus having an abnormality must be restored quickly. It is therefore required to detect occurrence of an abnormality immediately and locate the cause readily.

However, in electron-beam lithography apparatuses of related arts, the above abnormality is detected by inspecting actually transferred patterns or a semiconductor integrated circuit created on a wafer. Occurrence of the abnormality is recognized much later than lithography. This poses a problem in that many defects are manufactured until occurrence of an abnormality is recognized. Moreover, even if an abnormality is discovered, it is not easy to determine that the abnormality was caused by abnormal lithography. Too much time and labor are therefore needed to analyze the possible causes. In particular, the foregoing abnormal lithography is derived from noise or the like. Abnormal lithography does not therefore always occur and some kinds of abnormal lithography occur less frequently. It is very difficult to analyze these abnormalities.

SUMMARY OF THE INVENTION

An object of the present invention is to provide a charged-particle beam lithography apparatus and system capable of readily detecting an abnormality in controlling the on-off operation of a charged-particle (electron) beam employed in a charged-particle (electron) beam lithography apparatus, and readily finding out the cause of the abnormality.

A charged-particle beam lithography apparatus in accordance with the present invention attempts to accomplish the above object. A variation of a generated blanking signal is monitored, and a digital signal indicating the variation is produced. The digital signal is compared with exposure pattern data. Thus, it can be detected whether the on-off operation of a charged-particle beam is controlled according to the exposure pattern data.

Specifically, the charged-particle beam lithography apparatus, in accordance with the present invention, consists of a charged-particle beam generator, a charged-particle beam reshaping means, a charged-particle beam converging means, a charged-particle beam deflecting means, and a blanking means. The charged-particle beam generator generates a charged-particle beam. The charged-particle beam reshaping means reshapes the charged-particle beam. The charged-particle beam converging means converges the charged-particle beam on the surface of a sample. The charged-particle beam deflecting means deflects the charged-particle beam. The blanking means controls the on-off operation of the charged-particle beam. Herein, the blanking means includes a blanking signal generating circuit, a driver, and a blanking deflector. The blanking signal generating circuit generates a blanking signal used to control the on-off operation of the charged-particle beam according to exposure pattern data. The driver produces a driving signal according to the blanking signal. The blanking deflector deflects the charged-particle beam according to the driving signal so as to bring the charged-particle beam to a state in which it is intercepted by an intercepting means or a state in which it is not intercepted. The charged-particle beam lithography apparatus further consists of a digital converting circuit, and a comparing circuit. The digital converting circuit produces a blanking data signal that is a digital signal indicating a variation of the blanking signal from the blanking signal. The comparing circuit compares the blanking data signal with the exposure pattern data. It can be detected whether the on-off operation of the charged-particle beam is controlled according to the exposure pattern data.

In the charged-particle beam lithography apparatus in accordance with the present invention, the blanking signal is converted into a digital signal that can be compared with the exposure pattern data based on which the blanking data signal is produced. It can therefore be judged whether the charged-particle beam lithography apparatus is normal by comparing the change between the exposure pattern data and the digital signal converted from the blanking signal.

The blanking data signal is produced by converting an output of the blanking signal generating circuit or an output of the driver included in the blanking deflector. When the blanking data signal is produced from the output of the blanking signal generating circuit, it is detected whether the blanking signal generating circuit is normal. In this case, the exposure pattern data to be input to the blanking signal generating circuit is compared with the blanking data signal. The digital converting circuit and comparing circuit may be installed near the blanking signal generating circuit. When the blanking data signal is produced from the output of the driver, it is detected whether the blanking signal generating circuit, driver, and signal path between them are normal. In this case, the arrangement of the components will vary depending on where the driver is located. If the driver is located near the blanking signal generating circuit, the digital converting circuit and comparing circuit may be, as mentioned above, installed near the blanking signal generating circuit.

In contrast, the driver may be located far from the blanking signal generating circuit. The blanking signal may be transmitted from the blanking signal generating circuit to the driver over a first cable. In this case, the digital converting circuit is installed near the blanking signal generating circuit. The blanking signal transmitted to the driver over a second cable is converted in order to produce the blanking data signal. In this case, the driver is generally composed of a receiver for receiving the blanking signal transmitted from the blanking signal generating circuit and a drive circuit for producing a driving signal from an output of the receiver. The output of the receiver or the output of the drive circuit is transmitted to the digital converting circuit over the second cable. When the output of the receiver is transmitted, it is detected whether the blanking signal has been transmitted normally. When the output of the drive circuit is transmitted, it is also detected whether the driver is normal.

Furthermore, before the blanking signal is transmitted over the second cable, the blanking signal may converted into a digital blanking signal. Thus, the blanking signal may be transmitted in the form of a digital signal.

In the foregoing configuration, the exposure pattern data and blanking data signal are compared with each other in order to detected whether the blanking signal generating circuit, driver, and signal path between them are normal. Alternatively, it may be judged whether the produced exposure pattern data or blanking data signal is normal. In this case, limit data is pre-set. The limit data represents the limits of the exposure pattern data or blanking data signal. It is judged whether the produced exposure pattern data or blanking data signal exceeds the limit data. If the produced exposure pattern data or blanking date signal exceeds the limit data, it is judged to be abnormal. This abnormality detection may be carried out in combination with abnormality detection of detecting an abnormality in the blanking signal generating circuit, driver, and signal path between them.

The charged-particle beam lithography apparatus may be regarded as a column. A plurality of columns may be integrated into one system in an effort to improve throughput. A charged-particle beam lithography system for exposing a plurality of samples in parallel with one another to transfer the same exposure pattern is referred to as a multi-column system and is well known. The present invention may be adapted to the multi-column system. The multi-column system is provided with a synchronizing means for synchronizing actions of the columns with an action of a column that is the slowest to react on each processing. This is intended to adjust differences among the columns. In this case, one of the plurality of columns is regarded as a reference apparatus. The reference apparatus includes a coefficient memory and a comparing means. Differences in variation between the signal generated by a blanking signal generating circuit in the reference apparatus and the signals generated by blanking signal generating circuits in the other columns are measured in advance and stored as coefficients in the coefficient memory. The comparing means compares the variations of the signals, which are generated by the blanking signal generating circuits in the columns other than the reference apparatus, with the product of the variation of the signal, which is generated by the blanking signal generating circuit in the reference apparatus, by the coefficient. If the values disagree with each other or greatly differ from each other, it is judged that an abnormality has occurred.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Prior to a description of embodiments of the present invention, the basic configuration of an electron-beam lithography apparatus to which the present invention is adapted will be explained below.

Figure 1:
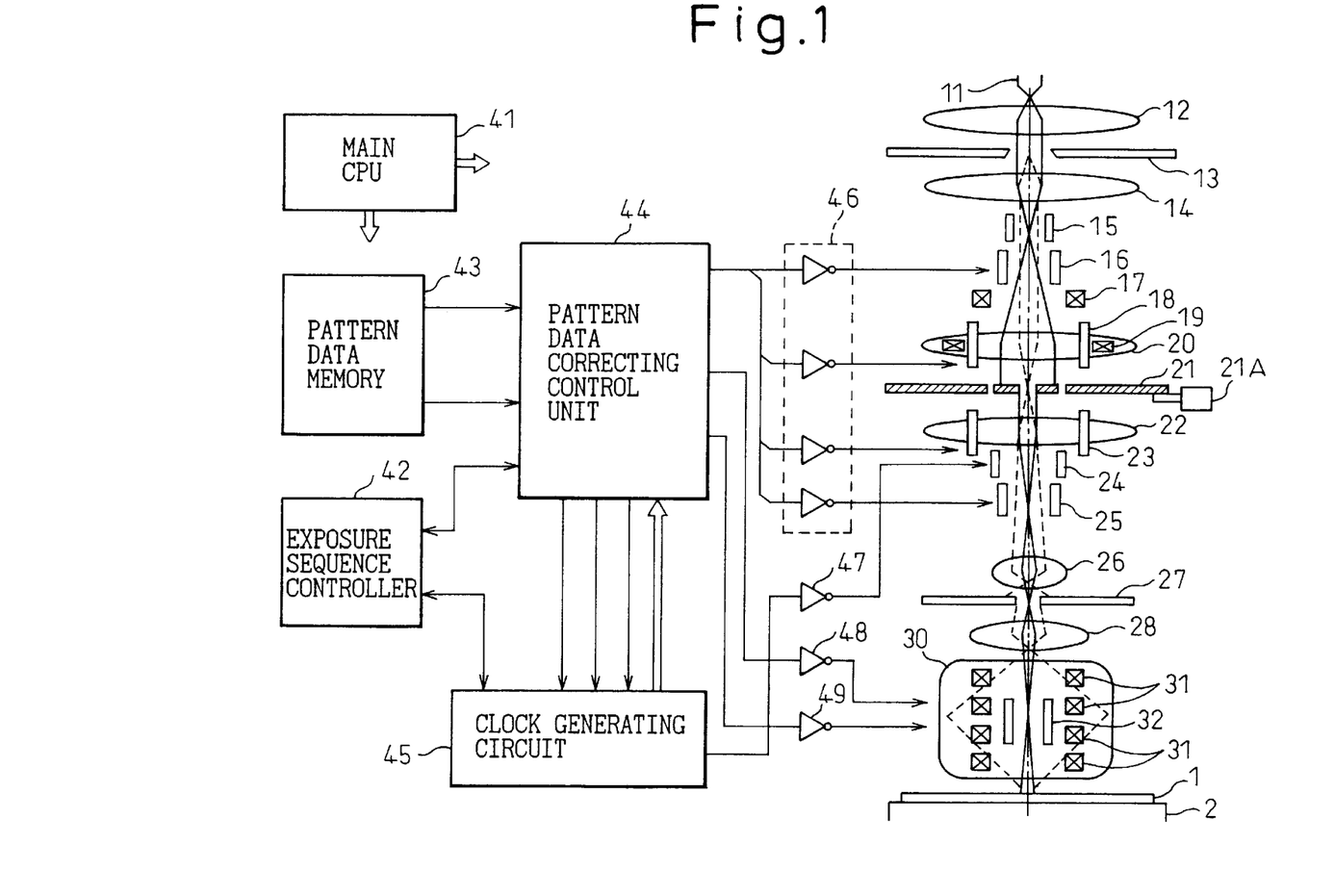
FIG. 1 is a diagram showing the structure of an optoelectronic column included in an electron-beam lithography apparatus, and the configuration of an exposure control unit.

FIG. 1 is a diagram showing the configuration of a beam irradiation system in an electron-beam lithography apparatus adopting the block exposure mode. In FIG. 1, an electron gun 11 generates an electron beam. A first condenser 12 collimates the electron beam emanating from the electron gun 11. An aperture 13 reshapes a passing beam composed of parallel rays in line with a desired form. A second condenser 14 narrows the reshaped beam. A deflector 15 is intended fro reshaping. Also shown are a first mask deflector 16, a deflector 17 for dynamically correcting an astigmatism caused by a mask, a second mask deflector 18, a mask focusing coil 19, and a first reshaping lens 10. Moreover, there are shown a block exposure mask 21 moved by a stage 21A, a second reshaping lens 22, a third mask deflector 23, and a blanking deflector 24 for controlling the on-off operation of the beam. Besides, there are shown a fourth mask deflector 25, a third lens 26, a round aperture 27, a reduction lens 28, a projection lens 30, an electromagnetic main deflector 31, and an electrostatic sub deflector 32. These components constitute an optoelectronic lens barrel that is referred to as a column. An electron beam 10 output from the column is irradiated to a sample (wafer) 1 placed on a stage 2. The stage is moved two-dimensionally on a plane perpendicular to the electron beam 10.

The electron-beam lithography apparatus includes an exposure control unit for controlling the components of the column so that a desired pattern will be transferred. The exposure control unit produces an exposure pattern from delineation information, and outputs a signal to be applied to the components of the column according to the exposure pattern. The exposure control unit includes a main CPU 41, an exposure sequence controller 42, a memory in which delineation information is stored, a pattern data memory 43, a pattern data correcting control unit 44, and a clock generating circuit 45. The main CPU 41 carries out delineation. The exposure sequence controller 42 controls the column according to a signal output from the exposure control unit. A produced pattern is stored in the pattern data memory 43. The pattern data correcting control unit 44 produces a signal to be applied to the components of the column from the pattern stored in the pattern data memory 43. The clock generating circuit 45 generates a clock used to synchronize the actions of the components. Normally, a blanking signal to be applied to the blanking deflector 24 is generated by the clock generating circuit 45. The other signals are generated by the pattern data correcting control unit 44. A mask deflector signal produced by the pattern data correcting control unit 44 is applied to mask deflectors 16, 18, 22, and 25 via a mask deflector driver 46. A major deflector signal is applied to a major deflector 31 via a major deflector driver 49. A minor deflector signal is applied to a minor deflector 32 via a minor deflector driver 48. A blanking signal generated by the clock generating circuit 45 is applied to a blanking deflector 24 via a blanking deflector driver 47.

For transferring a desired pattern, the deflectors 15 to 18, 23 and 24 are controlled in order to select a mask, to which an electron beam is irradiated, according to pattern data. The main deflector 31 and sub deflector 32 are controlled so that an electron beam reshaped in line with the selected mask will be irradiated to a desired position. The blanking deflector 24 is controlled so that the electron beam will be irradiated over a predetermined time after being brought to the desired position. The electron-beam lithography apparatus is widely adopted. A further description of the electron-beam lithography apparatus will be omitted herein.

With the blanking signal to be applied to the blanking deflector 24, the on-off operation of the electron beam is controlled, that is, whether or not the electron beam is irradiated to a sample is controlled. The magnitudes of deflections made by the deflecting means must be varied depending on a position to be exposed or the position of an aperture. Some time is required from the instant the magnitudes of deflections are varied to the instant the electron beam is deflected by a desired magnitude and stabilized. The time is called a settling time. After a previous shot is completed, the magnitudes of deflections to be made by the deflecting means are varied depending on an exposed position to be exposed by the next shot or the position of an aperture. When it becomes possible to transfer a desired unit pattern to a desired exposed position, that is, when the settling time has elapsed, exposure is carried out over a predetermined exposure time. The upper and lower limits of the exposure time are specified. When the upper limit is exceeded, overexposure occurs, the width of an exposure pattern gets larger, and the spacing between adjoining lines gets smaller. This poses a problem in that adjoining lines are linked (in the case of a positive resist). Moreover, when the lower limit is exceeded, underexposure occurs. The width of an exposure pattern gets smaller, and lines are cut out (in the case of the positive resist). Consequently, the exposure time (shot time) must the set with high precision.

On the other hand, the settling time varies depending on changes in magnitudes of deflections. For example, when the position of an aperture through which an electron beam is irradiated for the next exposure, or the next exposed position is far away from the current position, the settling time gets longer. A maximum settling time required for exposing one chip (or wafer) may be estimated, and the electron beam may always be turned off over the settling time. In this case, exposure can be achieved accurately. However, the exposure time is so long that throughput deteriorates. The settling time is therefore calculated according to the changes in magnitudes of deflections made by the deflecting means. The pattern data correcting control unit 44 and clock generating circuit 45 in FIG. 1 carry out this processing.

Exposure may be carried out before the settling time elapses. This means that exposure is carried out before an electron beam reaches a desired position. This poses a problem in that a different aperture may be selected or a different exposed position may be exposed. In contrast, assume that exposure is carried out after the settling time elapses. No problem can occur. However, in reality, there is a problem. Specifically, counting for indicating the settling time and counting for indicating the exposure time are synchronized with each other. Before the exposure time elapses, changing the magnitudes of deflections is started for the next shot. A problem therefore occurs, which is the same as that occurring when exposure is carried out before the settling time elapses. It is therefore required to carry out counting accurately to indicate the settling time.

A blanking signal is a signal used to control the on-off operation of an electron beam. The blanking signal is on (the beam is off) during the settling time. The blanking signal is off (the beam is on) during the subsequent shot time. If the blanking signal is not turned on or off according to specific timing, the foregoing problems occur. The blanking signal must therefore be a signal accurately proportional to exposure data.

Embodiments of the present invention will be described below, wherein a multi-column electron beam lithography system includes a plurality of columns and exposes a plurality of samples to transfer the same exposure pattern thereto.

Electron-beam lithography apparatuses (columns) constitute a system in accordance with the first embodiment of the present invention. The electron-beam lithography apparatuses have the configuration shown in FIG. 1. However, the main CPU 41, exposure sequencer 42, pattern data memory 43, pattern data correcting control unit 44, and clock generating circuit 45 are shared by the electron-beam lithography apparatuses. As described below, the pattern data correcting control unit 44 and clock generating circuit 45 have circuits associated with the columns. The circuits are synchronized mutually. The description of components identical to those of the related art will be omitted, and only components relating to the present invention will be described below.

Figure 2:
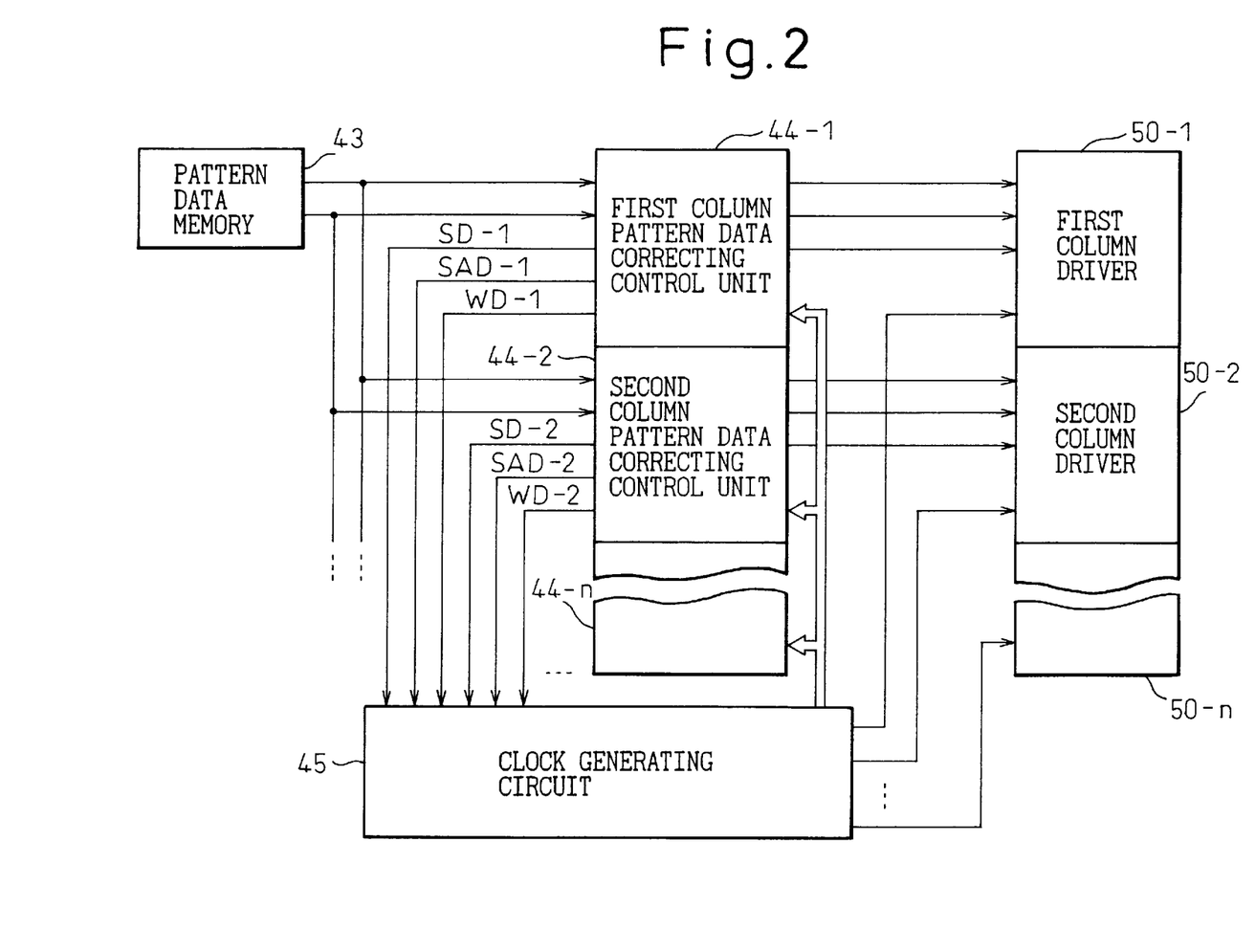
FIG. 2 is a diagram showing the configuration of an exposure control unit in the first embodiment of the present invention.

FIG. 2 is a diagram showing the configuration of an exposure control unit in the system of the first embodiment. As illustrated, the pattern data correcting control unit 44 is composed of pattern data correcting control units 44-1, 44-2, etc., and 44-n associated with the plurality of columns constituting the system. The column pattern data correcting control units output shot time data SD-1, SD-2, etc., and SD-n, shot time correction data SAD-1, SAD-2, etc., and SAD-n, and deflection/settlement wait time data WD-1, WD-2, etc., and WD-n to the clock generating circuit 45. The mask deflector driver 46, major deflector driver 49, minor deflector driver 48, and blanking deflector driver 47 are shown as a group of drivers. Groups of drivers 50-1, 50-2, etc., and 50-n are associated with the columns. The pattern data correcting control unit 44-1, 44-2, etc., and 44-n output driving signals associated with the columns to the associated groups of drivers. The clock generating circuit 45 outputs blanking signals associated with the columns to the groups of drivers.

Figure 3:
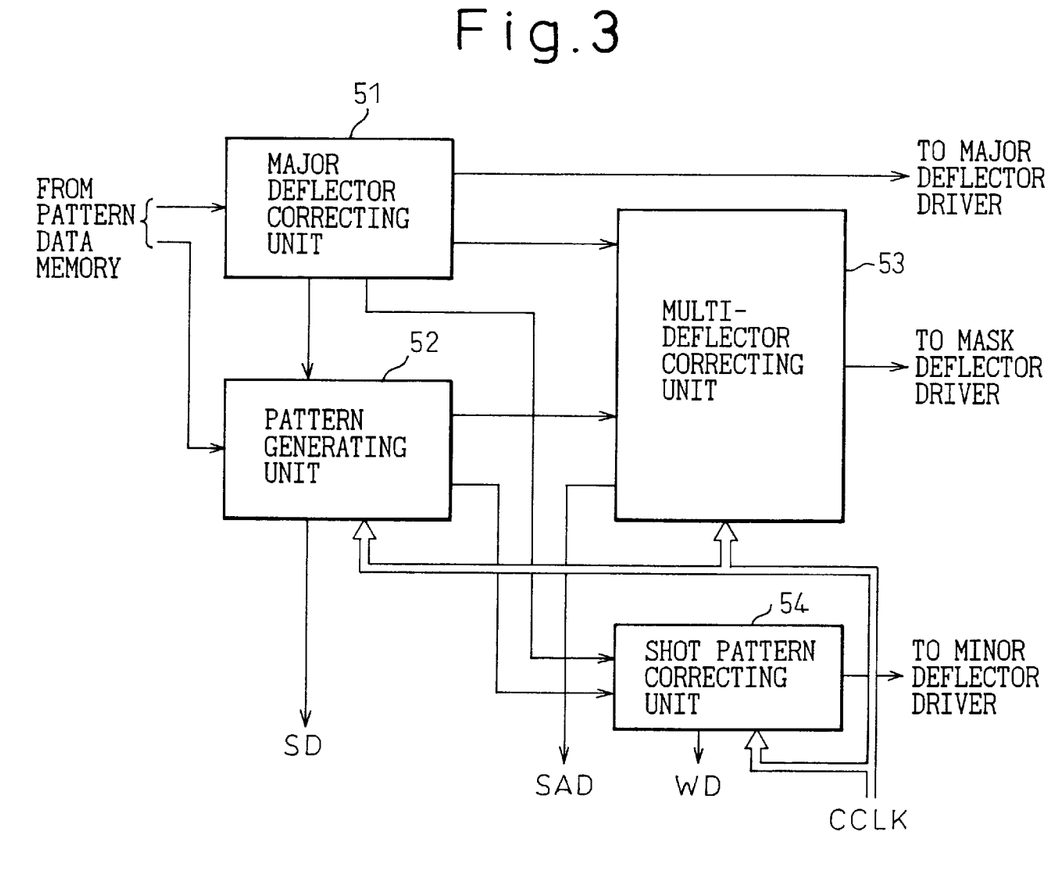
FIG. 3 is a diagram showing the configuration of a pattern data correcting control unit in the first embodiment.

FIG. 3 is a diagram showing the configuration of the pattern data correcting control units 44-1, 44-2, etc., and 44-n. As illustrated, pattern data supplied from the pattern data memory 43 is input to a major deflector corrector correcting unit 51 and pattern generating unit 52. The major deflector correcting unit 51 produces a major deflector signal according to the pattern data. The pattern generating unit 52 receives a signal from the major deflector correcting unit 51, and an arithmetic operation clock CCLK from the clock generating circuit 45. The pattern generating unit 52 outputs shot time data SD and the results of processing to a mask deflector correcting unit 53 and shot pattern correcting unit 54. The mask deflector correcting unit 53 produces shot time correction data SAD from a signal output from the major deflector correcting unit 51, a signal output from the clock generating circuit 45, and the arithmetic operation clock CCLK. The mask deflector correcting unit 53 also produces a mask deflector signal and outputs it to the mask deflector driver. The shot pattern correcting unit 54 produces deflection/settlement wait time data WD from the signal sent from the major deflector correcting unit 51, the signal sent from the clock generating circuit 45, and the arithmetic operation clock CCLK. The shot pattern correcting unit 54 also produces a minor deflector signal and outputs it to the minor deflector driver. These components are identical to those of the related art. A further description will be omitted.

Figure 4A:
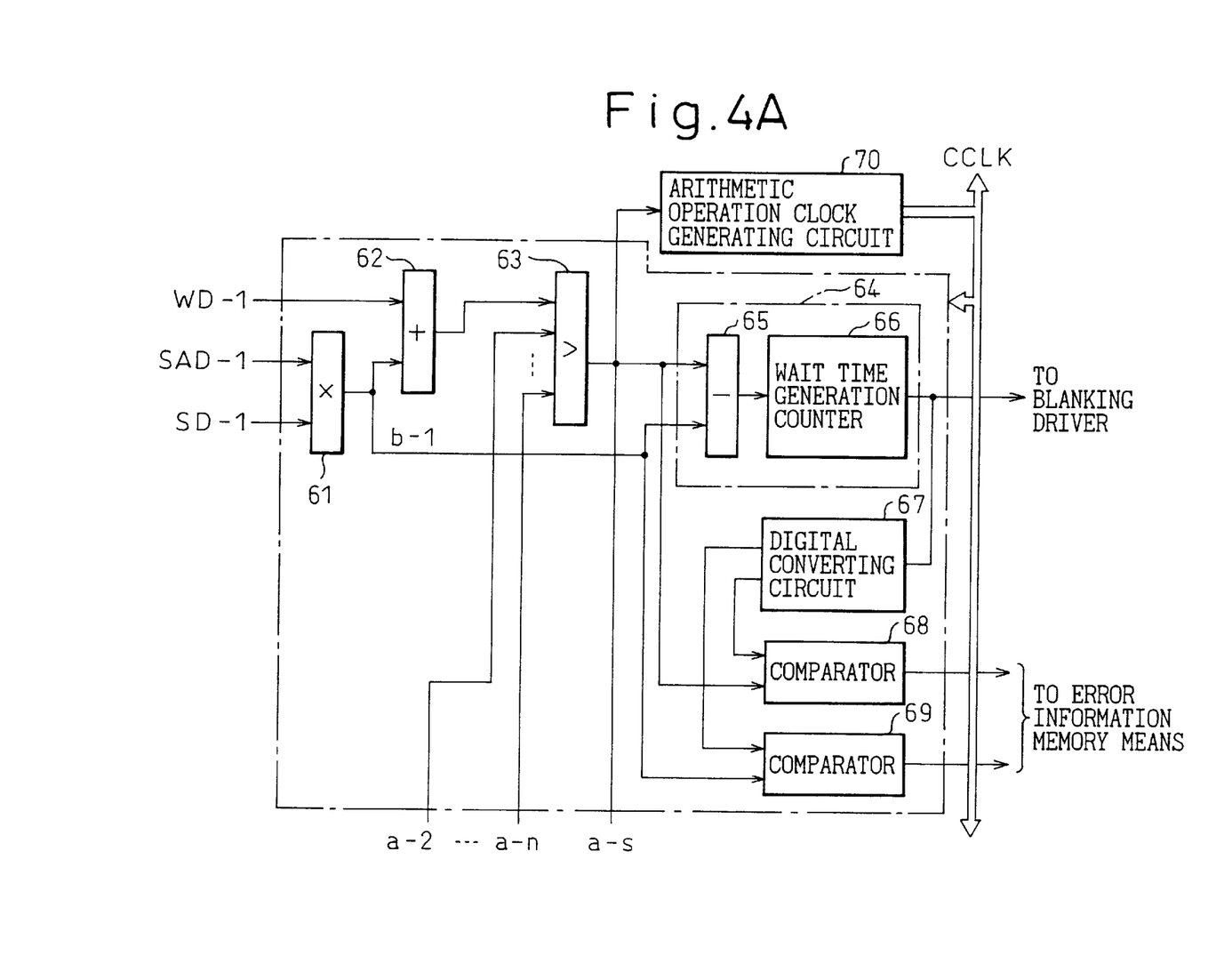
FIG. 4A and FIG. 4B are diagrams showing the configuration of parts of a correction clock generating circuit in the first embodiment.
Figure 4B:
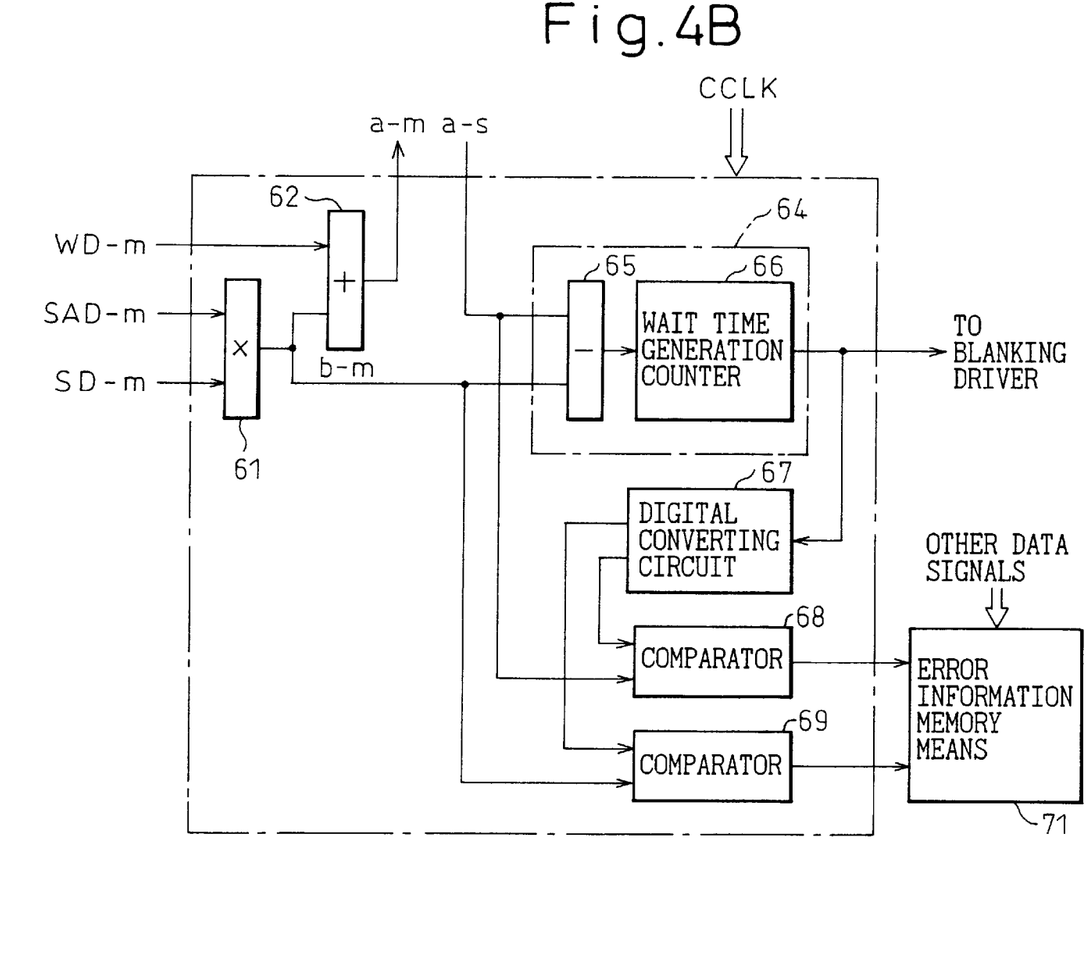

FIG. 4A and FIG. 4B are diagrams showing the configuration of the clock generating circuit 45. FIG. 4A shows a first clock circuit for generating a signal that is to be sent to a first column serving as a reference column. FIG. 4B shows a clock circuit for generating a signal to be sent to any column other than the first column. As illustrated, a difference of the first clock circuit from the other clock circuits lies in a point that the first clock circuit is provided with a maximum value detecting circuit 63 and an arithmetic operation clock generating circuit 70. The maximum value detecting circuit 63 detects a maximum value of wait time data produced by each clock circuit.

In each clock circuit, a multiplier 61 calculates the product of shot time data SD, which represents a shot time required by each column, by shot time correction data SAD. An adder 62 calculates the sum of the product and deflection/settlement wait time data WD. An output of the multiplier 61 is called a corrected shot time. The clock circuits other than the one associated with the first column send outputs A-1, a-2, etc., and a-n of the adders 62 to the maximum value calculating circuit 63 in the first column clock circuit. The maximum value calculating circuit 63 calculates a maximum value of the outputs of the adders 62 in the clock circuits associated with the first column and other columns. The maximum value represents a maximum wait time a-s. The maximum wait time is supplied to the columns and to an arithmetic operation clock generating circuit 70. In each column, a shot wait time generating circuit 64 produces a blanking signal from the maximum wait time a-s and a corrected shot time. The shot time generating circuit 64 includes a subtractor 65 for calculating the difference between the maximum wait time a-s and corrected shot time, and a wait time generating counter 66 for counting pulses to indicate the difference. The generated blanking signal is supplied to the blanking deflector driver. Thus, each column spends a maximum wait time to go along with a column that requires the longest wait time. When all the columns have irradiated an electron beam for exposure, they concurrently expose samples over a shot time. However, the shot time is different from column to column. The foregoing sequence is identical to that in accordance with the related art.

The first embodiment includes a digital converting circuit 67, comparators 68 and 69, and an error information memory means 71. The digital converting circuit 67 branches a blanking signal output from the shot wait time generating circuit 64, and converts the branch voltage into a blanking data signal representing wait time data and shot time data. The comparators 68 and 69 compare wait time data with a maximum wait time a-s, and shot time data with a corrected shot time respectively. Stored in the error information memory means 71 are the position of an exposure pattern set when the results of comparison performed by the comparators 68 and 69 in each column disagree with those performed by the comparators 68 and 69 in the reference column. Herein, the comparators 68 and 69 compare the wait time data with the maximum wait time a-s, and the shot time data with the corrected shot time respectively. In the digital converting circuit 67, the blanking signal is converted into binary digital data by means of an analog converter or flip-flops. A counter offering a high resolution is used to measure a time during which "0" or "1" is output. The count values are converted into numerical values. Wait time data and shot time data are produced according to the format adopted to indicate the maximum wait time a-s and corrected shot time. The comparators 68 and 69 compare the wait time data with the maximum wait time a-s and the shot time data with the corrected shot time respectively within certain threshold values. If the action of the shot wait time generating circuit 64 is normal, the results of comparison performed by the comparators 68 and 69 must agree with those performed by the counterparts in the reference unit. If not, an abnormality has occurred. If the results of comparison performed by the comparators 68 and 69 disagree with those performed by the counterparts, exposure is suspended immediately. Otherwise, after exposure is completed, an applied resist is peeled off and exposure is restarted. In other words, application of a resist and exposure should merely be restarted, but the wafer itself will not he wasted. Substantially, the yield can be improved.

Before exposure is restarted, the cause of an abnormality is analyzed based on error information stored in the error information memory means 71. The cause of the abnormality is then removed by performing a repair. The analyzing work can be achieved much more easily than it conventionally is, because the data of a position at which the abnormality has occurred is stored in the memory.

Figure 5:
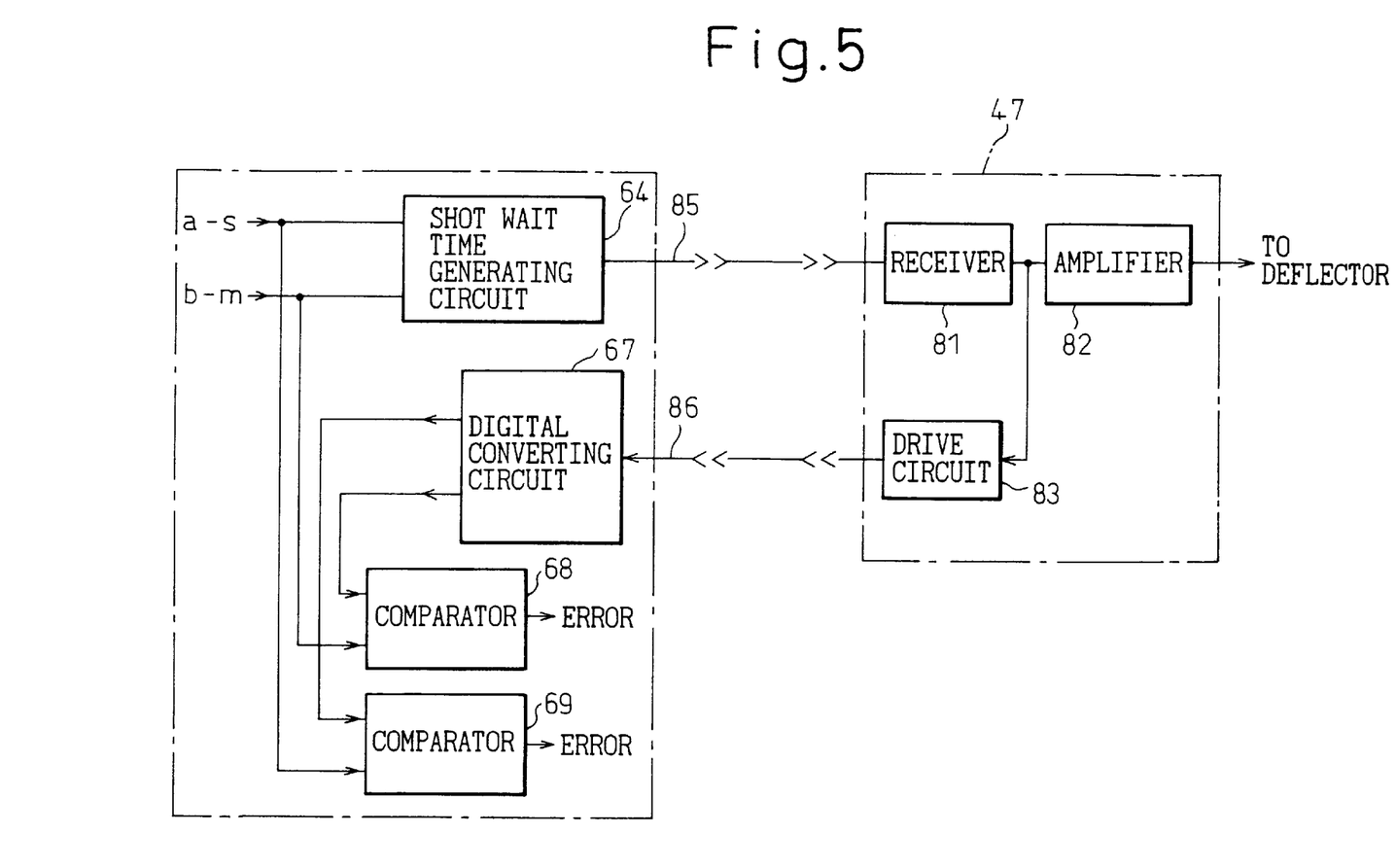
FIG. 5 is a diagram showing the configuration of a block including a shot wait time generating circuit and driver in the second embodiment.

FIG. 5 is a diagram showing the configuration of a block including the shot wait time generating circuit 64, blanking deflector driver 47, digital converting circuit 67, and comparators 68 and 69 in the second embodiment. The other components are identical to those of the first embodiment. As mentioned above, a high voltage is used to drive deflectors and lenses in the column and driver 47. The exposure control unit is installed, at a position far from the column and driver 47 in an effort to protect the exposure control unit, which produces an exposure pattern, from a noise stemming from the high voltage. A blanking signal generated by the shot wait time generating circuit 64 is transmitted to a driver 47 over a cable 85. The driver 47 is composed of a receiver 81 and amplifier 82. The blanking signal received by the receiver 81 is amplified into a high voltage by means of the amplifier 82, and applied to an electrode of the blanking deflector 24. In the second embodiment, the blanking signal received by the receiver 81 is transmitted to the digital converting circuit 67 located near the shot wait time generating circuit 64 over a second cable 86. The other components are identical to those of the first embodiment. In the second embodiment, a failure occurring in the shot wait time generating circuit 64 or on a signal path reaching the receiver in the driver 47 is detected.

In the second embodiment, an output of the amplifier 82 may be branched and thus transmitted to the digital converting circuit 67 through the drive circuit 83 over the second cable 86. In this case, actions including the action of the amplifier 82 are analyzed through comparison. Furthermore, the digital converting circuit 67 may be included in the driver 47.

Figure 6:
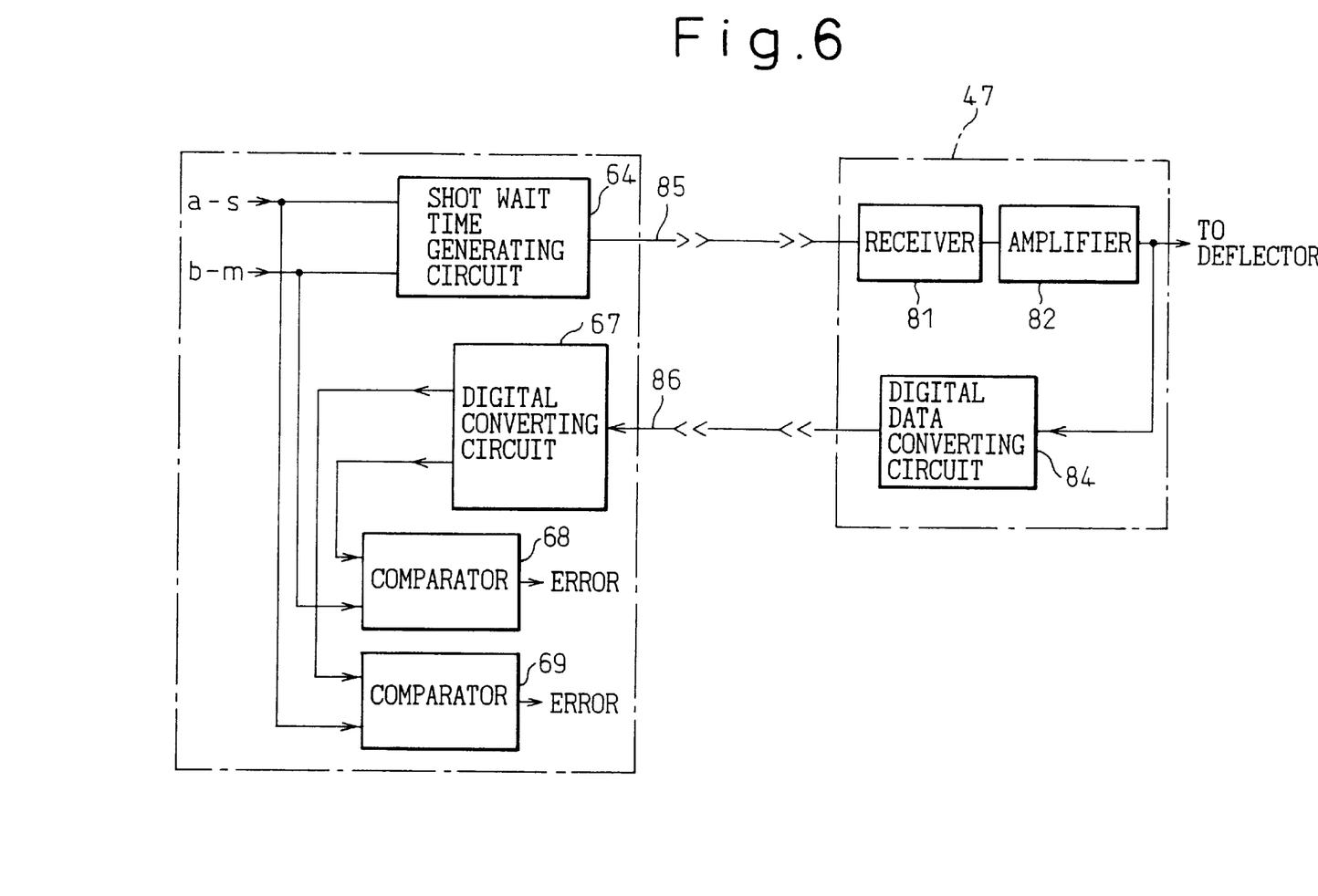
FIG. 6 is a diagram showing the configuration of a block including a shot wait time generating circuit and driver in the third embodiment.

FIG. 6 is a diagram showing the configuration of a block including the shot wait time generating circuit 64, blanking deflector driver 47, digital converting circuit 67, and comparators 68 and 69 in the third embodiment. In the third embodiment, an output of the amplifier 82 is branched and converted into digital data by a digital data converting circuit 84. Thereafter, the digital data is transmitted to the digital converting circuit 67 through a drive circuit 83 over the second cable 86. The other components are identical to those of the first and second embodiments. The digital data converting circuit 84 converts a blanking signal output from the amplifier 82 into binary digital data by means of a differential amplifier, analog converter, or flip-flops. The digital converting circuit 67 includes a counter offering a high resolution. The counter counts pulses to indicate a time over which transmitted digital data represents "0" or "1." The count values are converted into numerical values. Wait time data and shot time data are then produced according to the format adopted for the maximum wait time a-s and corrected shot time.

In the third embodiment, an output of the receiver 81 may be branched and converted into digital data by the digital data converting circuit 84. Thereafter, the digital date may be transmitted to the digital converting circuit 67 over the cable 86.

In the first to third embodiments, the blanking signal generated by the shot wait time generating circuit 64 associated with each column is converted inversely. The blanking signal is then compared with exposure pattern data supplied to the shot wait time generating circuit 64, that is, the maximum wait time and corrected shot time. In other words, it is detected whether the shot wait time generating circuit 64 and succeeding stages are normal. In contrast, in the fourth embodiment, it is detected whether exposure pattern data supplied to the shot wait time generating circuit 64 is normal.

Figure 7:
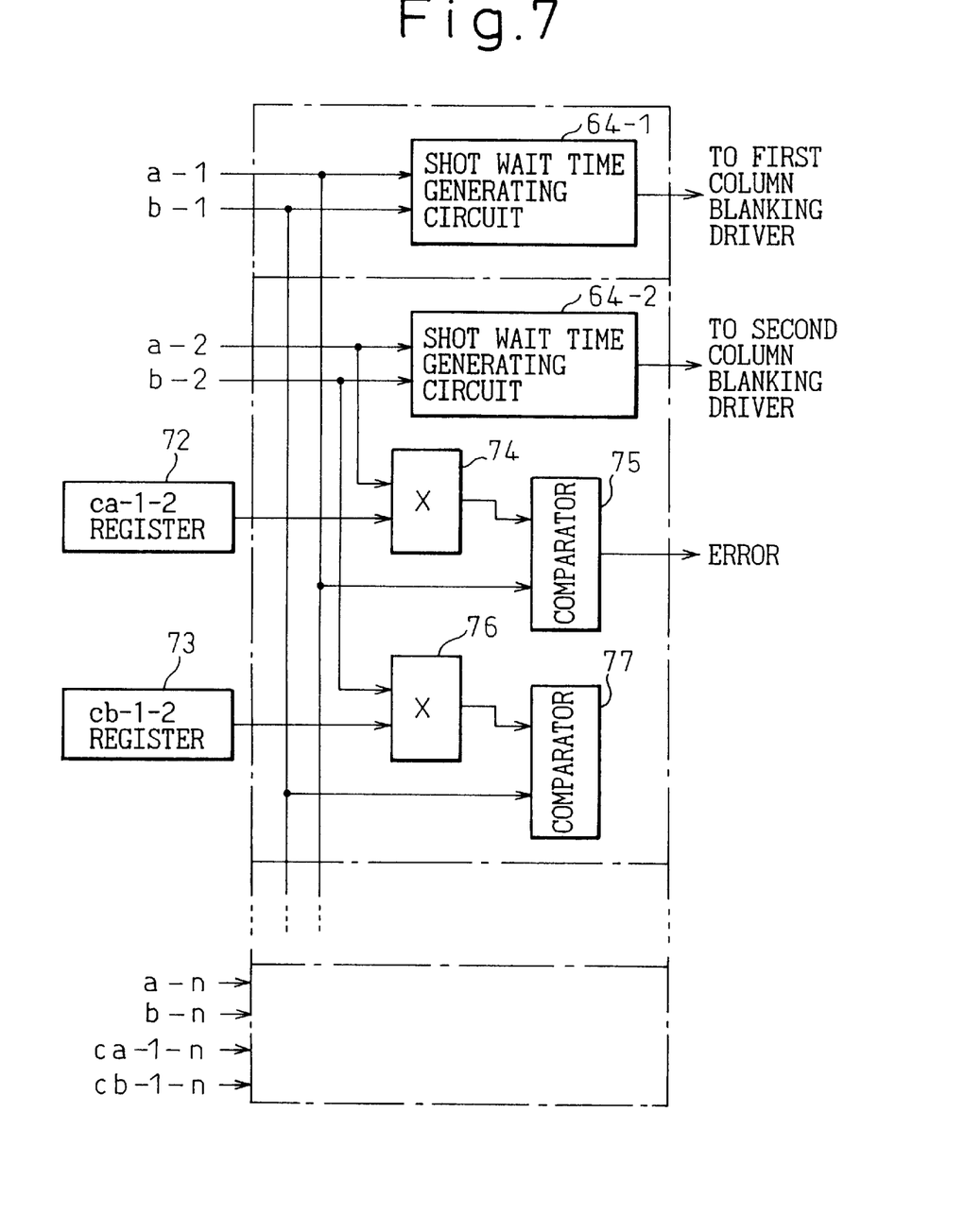
FIG. 7 is a diagram showing the configuration of a block including a shot wait time generating circuit and driver in the fourth embodiment.

FIG. 7 is a diagram showing a block including a shot wait time generating circuit 64 associated with each column in the fourth embodiment. The other blocks are identical to those of the aforesaid embodiments or related art. In the fourth embodiment, the first column is regarded as a reference column. A wait time and a corrected shot time required by the reference column are used as reference values. Differences from wait times and corrected shot times required by the other columns are calculated as constants in advance. The constants of the wait times are stored in a ca-1-2 register 72, and the constants of the corrected shot times are stored in a cb-1-2 register 73. Multipliers 74 and 76 multiply a wait time a-m and corrected shot time b-m, which are required by the associated column, by the constants at every time of making a shot. Comparators 75 and 77 compare the resultant values with the wait time a-1 and corrected shot time b-1 required by the first column within certain threshold values. As mentioned above, each column exposes a sample to transfer the same exposure pattern side by side. A large difference cannot therefore be present between the wait time and corrected shot time. If a large difference is present, an abnormality has occurred. The fourth embodiment detects such an abnormality.

Figure 8:
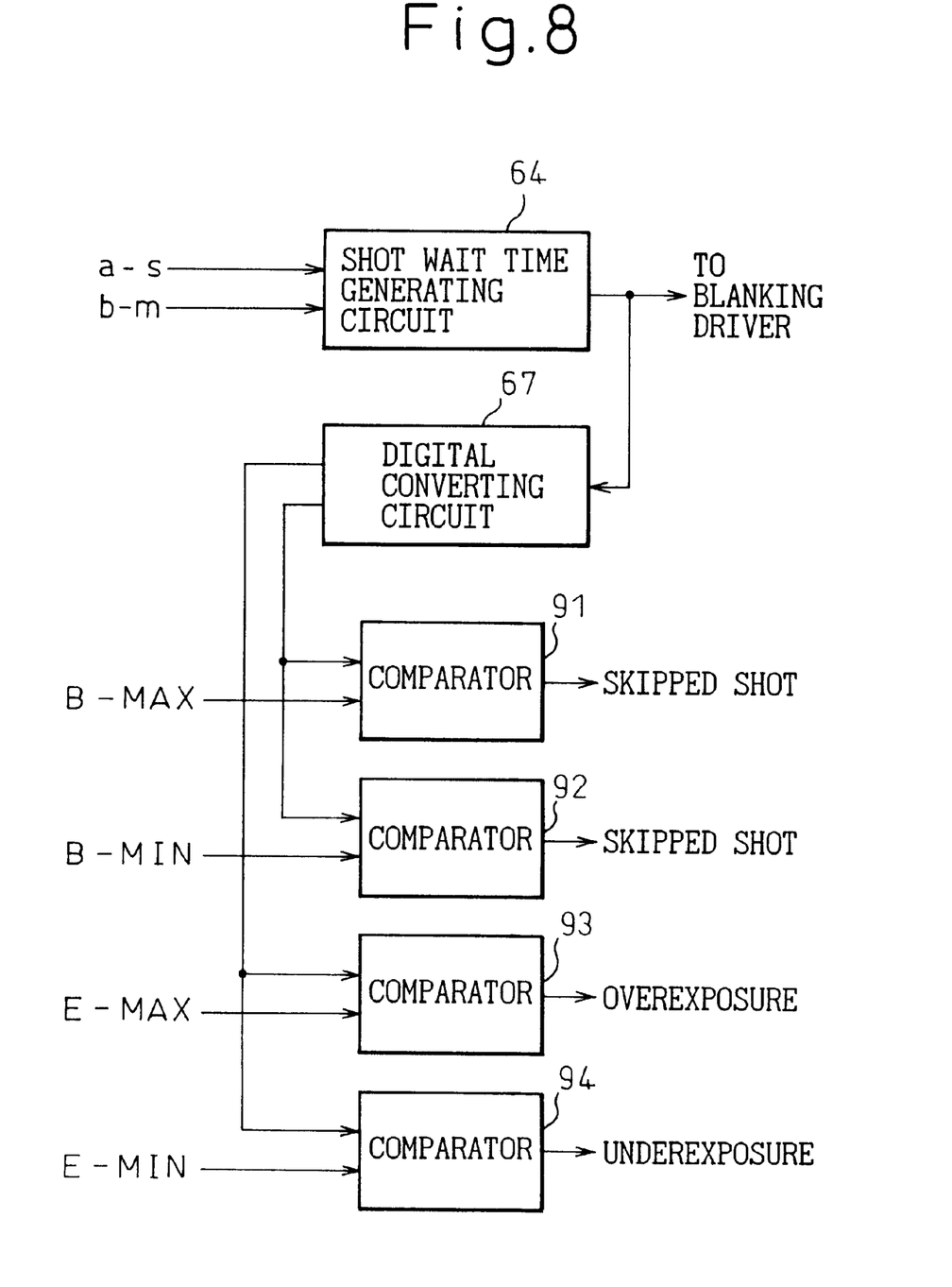
FIG. 8 is a diagram showing the configuration of a block including a shot wait time generating circuit and driver in the fifth embodiment.

FIG. 8 is a diagram showing the configuration of a block including the shot wait time generating circuit 64 associated with each column in the fifth embodiment. The other blocks are identical to those of the aforesaid embodiments In the fifth embodiment, a permissible range is predetermined relative to each of a shot wait time and shot time indicated by a blanking signal. When the permissible range is exceeded, it is judged that an abnormality has occurred. The blanking signal output from the shot wait time generating circuit 64 is converted into wait time data and shot time data by the digital converting circuit 67. The wait time and shot time are then compared with upper limits B-MAX and E-MAX and lower limits B-MIN and E-MIN by means of comparators 91 to 94. Consequently, a DC abnormality can be detected, that is, it is detected that the blanking signal is fixed to one state over a long period of time.

Incidentally, instead of the wait time data and shot time data produced by the digital converting circuit 67, a wait time signal and corrected shot time signal supplied to the shot wait time generating circuit 64 may be compared with the upper values and lower values.

Embodiments of the present invention have been described above. Various variants can be constructed based on the present invention. For example, the aforesaid configurations of the embodiments may be combined in order to detect abnormalities occurring in components.

As described so far, according to the present invention, it can be monitored all the time whether a charged-particle beam lithography apparatus can control the on-off operation of an electron beam normally. If an abnormality occurs, it can be connected immediately. Also, the cause of the abnormality can be found readily. Consequently, the availability of the apparatus can be improved and the throughput thereof can also be improved.

What is claimed is:

1. A charged-particle beam lithography apparatus, comprising:
    a charged-particle beam generator for generating a charged-particle beam;
    a charged-particle beam reshaping means for reshaping the charged-particle beam;
    a charged-particle beam converging means for converging the charged-particle beam on the surface of a sample;
    a charged-particle beam deflecting means for deflecting the charged-particle beam;
    a blanking means for controlling the on-off operation of the charged-particle beam, said blanking means including a blanking signal generating circuit for generating a blanking signal used to control the on-off operation of the charged-particle beam according to exposure pattern data, a driver for producing a driving signal from the blanking signal, and a blanking deflector for deflecting the charged-particle beam according to the driving signal so as to bring the charged-particle beam into a state in which the charged-particle beam is intercepted by an intercepting means or a state in which the charged-particle beam is not intercepted thereby;
    a digital converting circuit for producing a blanking data signal, which is a digital signal indicating a variation of the blanking signal, from the blanking signal; and
    a comparing circuit for comparing the blanking data signal with the exposure pattern data to determine whether the on-off operation of the charged-particle beam is controlled according to the exposure pattern data.

2. A charged-particle beam lithography apparatus according to claim 1, wherein said digital converting circuit converts an output of said blanking signal generating circuit and thus produces the blanking data signal.

3. A charged-particle beam lithography apparatus according to claim 1, wherein said digital converting circuit converts an output of said driver and thus produces the blanking data signal.

4. A charged-particle beam lithography apparatus according to claim 1, wherein said driver is installed far from said blanking signal generating circuit, and the blanking signal is transmitted from said blanking signal generating circuit to said driver over a first cable; and
    said digital converting circuit lies near said blanking signal generating circuit, converts the blanking signal transmitted to said driver over a second cable, and thus produces the blanking data signal.

5. A charged-particle beam lithography apparatus according to claim 1, wherein said comparing circuit compares the blanking data signal with predetermined limit data; and when the limit data is exceeded, an error signal is produced.

6. A charged-particle beam lithography apparatus, comprising:
    a charged-particle beam generator for generating a charged-particle beam;
    a charged-particle beam reshaping means for reshaping the charged-particle beam;
    a charged-particle beam converging means for converging the charged-particle beam on the surface of a sample;
    a charged-particle beam deflecting means for deflecting the charged-particle beam;
    a blanking means for controlling the on-off operation of the charged-particle beam, said blanking means including a blanking signal generating circuit for generating a blanking signal used to control the on-off operation of the charged-particle beam according to exposure pattern data, a driver for producing a driving signal from the blanking signal, and a blanking deflector for deflecting the charged-particle beam according to the driving signal so as to bring the charged-particle beam into a state in which the charged-particle beam is intercepted by an intercepting means or a state in which the charged-particle beam is not intercepted thereby;
    a digital converting circuit for producing a blanking data signal, which is a digital signal indicating a variation of the blanking signal, from the blanking signal; and
    a comparing circuit for comparing the blanking data signal with the exposure pattern data to determine whether the on-off operation of the charged-particle beam is controlled according to the exposure pattern data;
    said driver being installed far from said blanking signal generating circuit, and the blanking signal being transmitted from said blanking signal generating circuit to said driver over a first cable;
    said digital converting circuit lying near said blanking signal generating circuit, converting the blanking signal transmitted to said driver over a second cable, and thus producing the blanking data signal;
    wherein said driver includes a receiver for receiving the blanking signal transmitted from said blanking signal generating circuit and a drive circuit for producing the driving signal from an output of said receiver; and
    said second cable is used to transmit the output of said receiver to said digital converting circuit.

7. A charged-particle beam lithography apparatus according to claim 6, wherein said driver includes a blanking digital converting circuit for converting an output of said receiver or drive circuit into a digital blanking signal,
    an output of said blanking digital converting circuit is transmitted to said digital converting circuit over said second cable, and
    said digital converting circuit produces the blanking data signal from the digital blanking signal.

8. A charged-particle beam lithography apparatus, comprising:
    a charged-particle beam generator for generating a charged-particle beam;
    a charged-particle beam reshaping means for reshaping the charged-particle beam;
    a charged-particle beam converging means for converging the charged-particle beam on the surface of a sample;
    a charged-particle beam deflecting means for deflecting the charged-particle beam;

a blanking means for controlling the on-off operation of the charged-particle beam, said blanking means including a blanking signal generating circuit for generating a blanking signal used to control the on-off operation of the charged-particle beam according to exposure pattern data, a driver for producing a driving signal from the blanking signal, and a blanking deflector for deflecting the charged-particle beam according to the driving signal so as to bring the charged-particle beam into a state in which the charged-particle beam is intercepted by an intercepting means or a state in which the charged-particle beam is not intercepted thereby;

a digital converting circuit for producing a blanking data signal, which is a digital signal indicating a variation of the blanking signal, from the blanking signal; and a comparing circuit for comparing the blanking data signal with the exposure pattern data to determine whether the on-off operation of the charged-particle beam is controlled according to the exposure pattern data;

said driver being installed far from said blanking signal generating circuit, and the blanking signal being transmitted from said blanking signal generating circuit to said driver over a first cable;

said digital converting circuit lying near said blanking signal generating circuit, converting the blanking signal transmitted to said driver over a second cable, and thus producing the blanking data signal;

wherein said driver includes a receiver for receiving the blanking signal transmitted from said blanking signal generating circuit, and a drive circuit for producing the driving signal from an output of said receiver; and said second cable is used to transmit an output of said drive circuit to said digital converting circuit.

9. A charged-particle beam lithography apparatus according to claim 8, wherein said driver includes a blanking digital converting circuit for converting an output of said receiver or drive circuit into a digital blanking signal, an output of said blanking digital converting circuit is transmitted to said digital converting circuit over said second cable, and said digital converting circuit produces the blanking data signal from the digital blanking signal.

10. A charged-particle beam lithography apparatus having a charged-particle beam generator for generating a charged-particle beam, a charged-particle beam reshaping means for reshaping the charged-particle beam, a charged-particle beam converging means for converging the charged-particle beam on the surface of a sample, a charged-particle beam deflecting means for deflecting the charged-particle beam, and a blanking means for controlling the on-off operation of the charged-particle beam, said charged-particle beam lithography apparatus further comprising:

a comparing circuit for comparing a signal produced by said blanking means with predetermined limit data representing the limits of the signal, and for producing an error signal when the limit data is exceeded.

11. A charged-particle beam lithography system having a plurality of charged-particle beam lithography apparatuses, wherein each charged-particle beam lithography apparatus comprises:

a charged-particle beam generator for generating a charged-particle beam;

a charged-particle beam reshaping means for reshaping the charged-particle beam;

a charged-particle beam converging means for converging the charged-particle beam on the surface of a sample;

a charged-particle beam deflecting means for deflecting the charged-particle beam;

a blanking means for controlling the on-off operation of the charged-particle beam, said blanking means including a blanking signal generating circuit for generating a blanking signal used to control the on-off operation of the charged-particle beam according to exposure pattern data, a driver for producing a driving signal according to the blanking signal, and a blanking deflector for deflecting the charged-particle beam according to the driving signal so as to bring the charged-particle beam into a state in which the charged-particle beam is intercepted by an intercepting means or a state in which the charged-particle beam is not intercepted thereby;

a digital converting circuit for producing a blanking data signal, which is a digital signal indicating a variation of the blanking signal, from the blanking signal; and a comparing circuit for comparing the blanking data signal with the exposure pattern data to determine whether the on-off operation of the charged-particle beam is controlled according to the exposure pattern data; and said plurality of charged-particle beam lithography apparatuses expose samples to transfer the same pattern thereto according to the same exposure pattern data.

12. A charged-particle beam lithography system according to claim 11, further comprising:

a synchronizing means for synchronizing said plurality of charged-particle beam lithography apparatuses;

a counting memory in which differences in variation between a signal generated by said blanking signal generating circuit in a reference apparatus that is one of said plurality of charged-particle beam lithography apparatuses, and signals generated by said blanking signal generating circuits in apparatuses other than said reference apparatus of said plurality of charged-particle beam lithography apparatuses are measured in advance and stored as coefficients; and a comparing means for comparing the variations of the signals which are generated by said blanking signal generating circuits in said apparatuses other than said reference apparatus with the product of the variation of the signal which is generated by said blanking signal generating circuit in said reference apparatus.

* * * * *